United States Patent [19]

Ishikawa

[11] Patent Number: 5,748,018
[45] Date of Patent: May 5, 1998

[54] DATA TRANSFER SYSTEM FOR AN INTEGRATED CIRCUIT, CAPABLE OF SHORTENING A DATA TRANSFER CYCLE

[75] Inventor: Toru Ishikawa, Tokyo, Japan

[73] Assignee: NEC Corporation, Tokyo, Japan

[21] Appl. No.: 790,800

[22] Filed: Jan. 30, 1997

[30] Foreign Application Priority Data

Jan. 30, 1996 [JP] Japan .................... 8-013865

[51] Int. Cl.⁶ ........................................... H03L 7/00
[52] U.S. Cl. .......................... 327/154; 327/161; 327/162
[58] Field of Search ........................ 327/154, 161, 327/159, 160, 162; 375/359, 356

[56] References Cited

U.S. PATENT DOCUMENTS

| | | | |
|---|---|---|---|
| 5,268,937 | 12/1993 | Marbot | 375/359 |
| 5,548,620 | 8/1996 | Rogers | 327/161 |
| 5,636,165 | 6/1997 | Amatangelo et al. | 327/161 |

OTHER PUBLICATIONS

H. B. Bakoglu, Circuits, Interconnections, and Packaging for VLSI, 1990, pp. 343, 358, 359.

*Primary Examiner*—Toan Tran
*Attorney, Agent, or Firm*—Whitham, Curtis & Whitham

[57] ABSTRACT

In a data transfer system for use in an integrated circuit, a data output circuit comprises a D-FF for latching data to be transferred, in synchronism with an external clock signal, an output buffer receiving and outputting the data latched in the D-FF, and another output buffer receiving the external clock signal for outputting a delayed clock signal which is delayed from the external clock signal by a delay amount of the D-FF. On the other hand, a data input circuit including a first D-FF for receiving the data to be transferred outputted from the D-FF of the data output circuit, in synchronism with the delayed clock signal supplied from the D-FF of the data output circuit, and a second D-FF for fetching the data received in the first D-FF, in synchronism with the external clock signal.

7 Claims, 8 Drawing Sheets

DATA TRANSFER SYSTEM FOR AN INTEGRATED CIRCUIT, CAPABLE OF SHORTENING A DATA TRANSFER CYCLE

BACKGROUND OF THE INVENTION

1. Field of the Invention

The present invention relates to a data transfer system for use in an integrated circuit, and more specifically, to a data transfer system for use in an integrated circuit and capable of shortening a data transfer cycle.

2. Description of Related Art

Referring to FIG. 1A, there is shown a block diagram of a data output circuit of the data transfer system of this type in the prior art. As shown in FIG. 1A, a data output circuit 600 includes a D-type flipflop (called a "D-FF" hereinafter) 601 having a data input "D" receiving data to be transferred and a clock input "CK" connected to a clock terminal 603 to receive a clock signal CLK supplied from an external device (not shown), and an output buffer 602 having an input connected to a non-inverted data output Q of the D-FF 601 and an output connected to a data output terminal 604 for outputting the data.

Referring to FIG. 1B showing a timing chart illustrating an operation of the data output circuit shown in FIG. 1A, and assuming that an internal delay time of the D-FF 601 in response to the clock signal CLK is $t_q$, and a delay time of the output buffer 602 in response to the output of the D-FF 601 is $t_b$, a delay time $t_d$ in the data transfer as compared with the clock signal CLK is expressed as $t_q + t_b$.

Accordingly, assuming that a period of one data transfer cycle (namely, one cycle of the clock signal CLK) is Tcycle, and a set-up time of a data input circuit for receiving the data to be transferred is $t_s$, the data transfer cycle Tcycle cannot be made shorter than $t_d + t_s$.

Referring to FIG. 1C, there is shown a block diagram of a data output circuit of another example of the prior art data transfer system configured to shorten the data transfer cycle Tcycle and characterized by using a PLL (phase locked loop) circuit. As shown in FIG. 1C, a data output circuit 610 includes a D-FF 611 having a data input "D" to receive data to be transferred, a PLL circuit 613 having an input connected to a clock terminal 603 for receiving a clock signal CLK supplied from an external device and an output for outputting an internal clock signal CLKi, which is in turn supplied to a clock input "CK" of the D-FF 611, and an output buffer 612 having an input connected to a non-inverted data output Q of the D-FF 611 and an output connected to a data output terminal 615 for outputting the data.

Referring to FIG. 1D, there is shown a timing chart illustrating an operation of the data output circuit shown in FIG. 1C. In addition, assume that an internal delay time of the D-FF 611 in response to the clock signal is $t_q$, a delay time of the output buffer 612 in response to the output of the D-FF 611 is $t_b$, and an advance in time of the internal clock signal CLKi as compared with the external clock signal CLK is $t_p$, a delay time $t_d$ in the data transfer as compared with the clock signal CLK is expressed as $t_q + t_b - t_p$.

As seen from the above, by advancing the internal clock signal CLKi earlier than the external clock signal CLK by the time $t_p$, the delay time $t_d$ from the external clock signal CLK, namely, the delay time in the data transfer, is shortened, by the time $t_p$, in comparison with the example shown in FIG. 6A, and therefore, the data transfer cycle can be shortened by the time $t_p$.

In the above mentioned prior art example using the PLL circuit, however, the PLL circuit itself inevitably involves an unstable condition, called as a "lock time", until an output signal frequency becomes stable in response to an input signal frequency. Conventionally, this lock time is on the order of about 200 µs to about 1 ms, and during this lock time, it is impossible to access from an external. In addition, during this lock time, since an asynchronous and unstable internal clock signal is generated, an internal condition of the data output circuit becomes indefinite. In order to cancel this unstable condition, a reset cycle was required after the lock time, in order to reset the internal condition of the data output circuit.

Furthermore, provision of the PLL circuit results in increase of a necessary chip area.

SUMMARY OF THE INVENTION

Accordingly, it is an object of the present invention to provide a data transfer system for use in an integrated circuit, which has overcome the above mentioned defect of the conventional one.

Another object of the present invention is to provide a data transfer system for use in an integrated circuit and capable of shortening a data transfer cycle, so as to realize a high speed data transfer, without using the PLL circuit which makes the device unstable because of the lock time and which results an increased chip area.

The above and other objects of the present invention are achieved in accordance with the present invention by a data transfer system for use in an integrated circuit, including a data output circuit for outputting data and a data input circuit for receiving the data, the data output circuit comprising a data outputting means for outputting data to be transferred, in synchronism with an external clock signal supplied from an external, and a clock delay means receiving the external clock signal for outputting a delayed clock signal which is delayed from the external clock signal by a delay amount equal to a data delay amount of the data outputting means, and the data input circuit including a first stage for receiving the data to be transferred outputted from the data outputting means of the data output circuit, in synchronism with the delayed clock signal supplied from the clock delay means of the data output circuit, and a second stage for fetching the data received in the first stage, in synchronism with the external clock signal.

In a preferred embodiment, the delay amount of the clock delay means is set to $\{t_s + t_d - \text{Tcycle}\}$ where $t_s$ is a set-up time of the data input in the data input circuit, Tcycle is a data transfer cycle $t_d$ is the delay amount of the data to be transferred, as compared with the external clock signal.

In one embodiment of the data transfer system, the data output circuit further includes a data transfer control means for inhibiting the outputting of the data to be transferred, in response to a selection signal supplied from the external, and the data transfer system further included a second data output circuit having the same construction as that of the first mentioned data output circuit, a data output terminal of each of the data output circuits being connected in common to the data input circuit, the delayed clock signal outputted from only a selected one of the data output circuits being supplied to the first stage of the data input circuit.

In one embodiment of the data transfer system, the data output circuit further includes a data transfer control means for inhibiting the outputting of the data to be transferred, in response to a selection signal supplied from the external, and a delayed clock control means controlled by the data transfer control means for inhibiting the outputting of the delayed clock signal, and the data transfer system further includes a second data output circuit having the construction as that of the first mentioned data output circuit, a data output terminal of each of the data output circuits being connected in common to the data input circuit, and a delayed clock output terminal of each of the data output circuits being connected in common to the data input circuit, so that only the data and the delayed clock signal outputted from one selected by the selection signal, among the data output circuits, are supplied to the data input circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
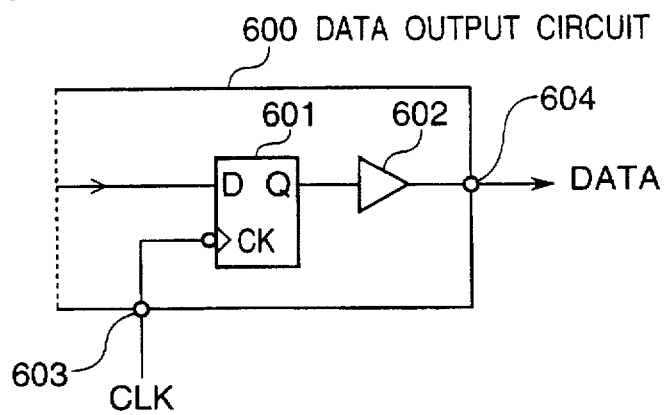
FIG. 1A is a block diagram of a data output circuit of the data transfer system of this type in the prior art.
Figure 1B:
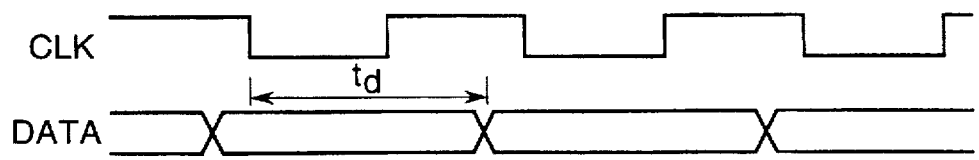
FIG. 1B is a timing chart illustrating an operation of the data output circuit shown in FIG. 1A.
Figure 1C:
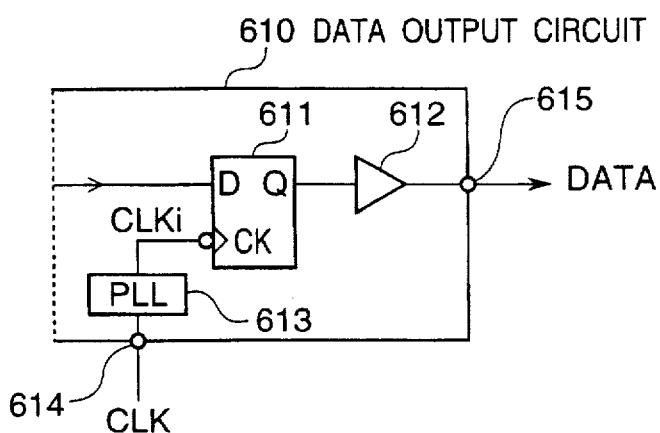
FIG. 1C is a block diagram of a data output circuit of another example of the prior art data transfer system, characterized by using a PLL circuit.
Figure 1D:
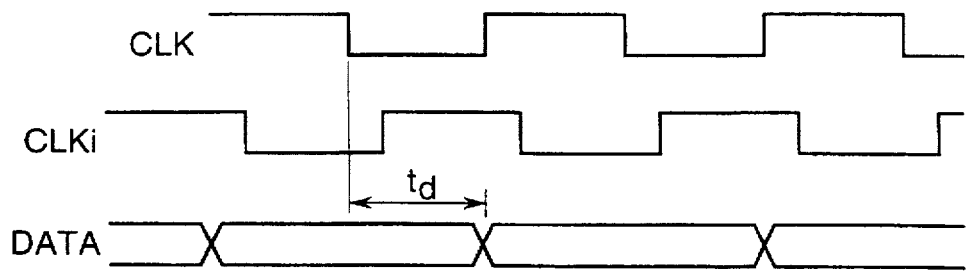
FIG. 1D is a timing chart illustrating an operation of the data output circuit shown in FIG. 1C.
Figure 2A:
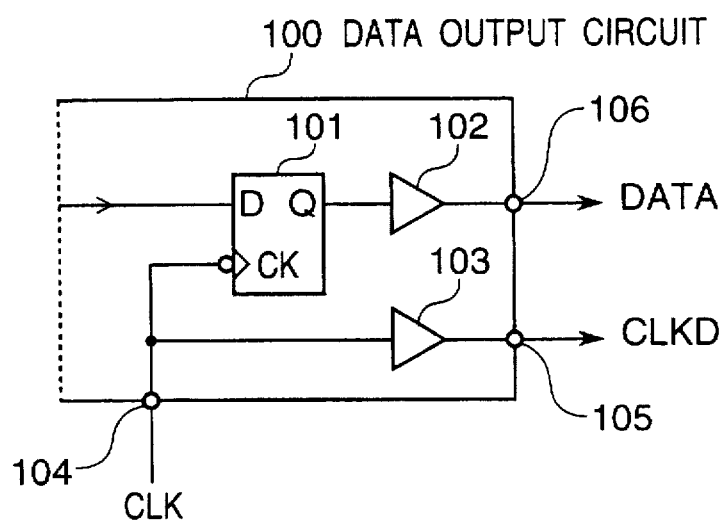
FIG. 2A is a block diagram of a data output circuit of a first embodiment of the data transfer system in accordance with the present invention.

Referring to FIG. 2A, there is shown a block diagram of a data output circuit of a first embodiment of the data transfer system in accordance with the present invention.

As shown in FIG. 2A, a data output circuit 100 includes a D-FF D-type flipflop) 101 having a data input "D" receiving data to be transferred and a clock input "CK" connected to a clock terminal 104 to receive a clock signal CLK supplied from an external device (not shown), and an output buffer 102 having an input connected to a non-inverted data output Q of the D-FF 101 and an output connected to a data output terminal 106 for outputting the data, and another output buffer 103 having an input connected to the clock terminal 104 to receive the external clock CLK and an output connected to a clock output terminal 105 for outputting a delayed clock CLKD which is delayed from the external clock signal CLK by a delay time of the output buffer 103.

Figure 2B:
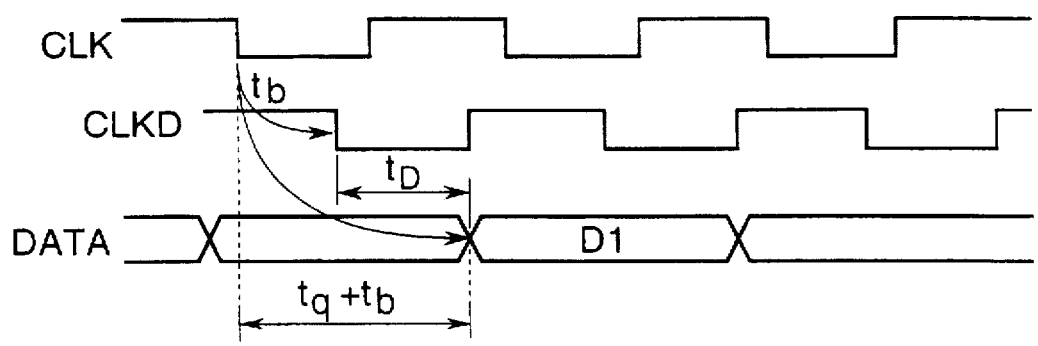
FIG. 2B is a timing chart illustrating an operation of the data output circuit shown in FIG. 2A.

Referring to FIG. 2B, there is shown a timing chart illustrating an operation of the data output circuit shown in FIG. 2A. In addition, assuming that an internal delay time of the D-FF 101 as compared with the external clock signal CLK is $t_q$, and a delay time of the output buffer 102 as compared with the output of the D-FF 101 is $t_b$, a delay time $t_d$ in the data transfer as compared with the external clock CLK is expressed as $t_q+t_b$. On the other hand, assuming that a difference in time between the external clock signal CLK and the delayed clock signal CLKD is $t_b$, a delay time $t_D$ in the data transfer as compared with the delayed clock CLKD is expressed as follows:

$$t_D=t_q+t_b-t_b=t_q$$

Accordingly, the delay time $t_D$ in the data transfer becomes equal to $t_q$, and therefore, this becomes substantially equivalent to the fact that the internal clock signal is advanced as compared with the external clock by the time $t_b$ by using the PLL circuit.

Figure 3A:
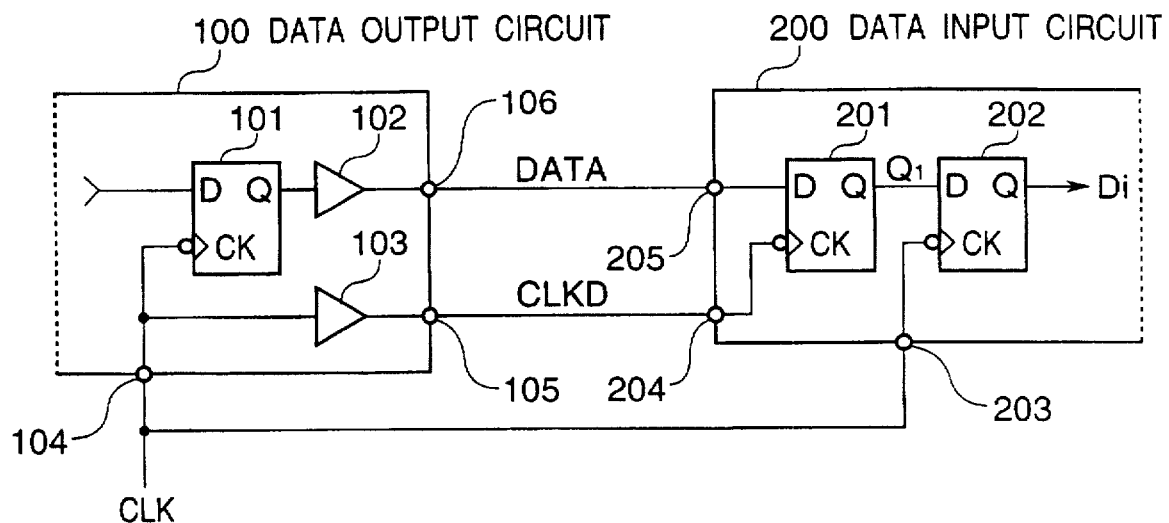
FIG. 3A is a block diagram of an essential part of the first embodiment of the data transfer system in accordance with the present invention, including the data output circuit shown in FIG. 2A and a data input circuit.

Referring to FIG. 3A, there is shown a block diagram of an essential part of the first embodiment of the data transfer system in accordance with the present invention, including the above mentioned data output circuit 100 and a data input circuit 200. In FIG. 3A, elements corresponding to those shown in FIG. 2A are given the same Reference Numerals, and explanation thereof will be omitted.

The data input circuit 200 has a data input terminal 205 connected to the data output terminal 106 of the data output circuit 100, a clock input terminal 204 connected to the clock output terminal 105 of the data output circuit 100, and another clock input terminal 203 connected to receive the external clock signal CLK supplied to the data output circuit 100. The data input circuit 200 also includes a D-FF 201 having a data input "D" connected to the data input terminal 205 and a clock input "CK" connected to the clock input terminal 204, and another D-FF 202 having a data input "D" connected to an non-inverted data output Q of the D-FF 201, a clock input "CK" connected to the clock input terminal 203 and an non-inverted data output Q for outputting an internal data signal Di.

Figure 3B:
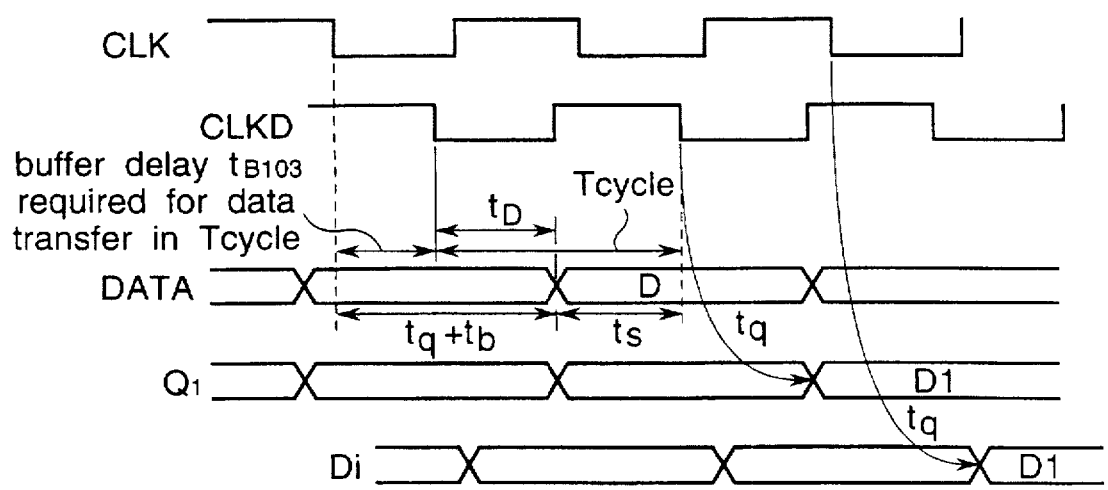
FIG. 3B is a timing chart illustrating an operation of the data transfer system shown in FIG. 3A.

Referring to FIG. 3B which is a timing chart illustrating an operation of the data transfer system shown in FIG. 3A, the transfer data outputted from the data output circuit 100 to a data transfer path, is supplied through the data input terminal 205 into the data input circuit 200), and latched in the D-FF 201 in synchronism with the delayed clock CLKD supplied to the clock input terminal 204. The transfer data "Q1" latched in the D-FF 201 is latched in the next-stage D-FF 202 in synchronism with the external clock CLK supplied to the clock input terminal 203, so that the received data is supplied from the D-FF 202 as an internal data Di.

In the above mentioned arrangement, the data input circuit 200 can be considered to use the delayed clock signal CLKD as an internal main clock, but in the shown embodiment, the delayed clock signal CLKD is used only as a local clock signal for the data transfer, namely, the data receiving, and the external clock signal CLK is used as the main clock.

Here, assuming that a set-up time of the data input circuit 200 is $t_s$, and a period of a data transfer cycle is Tcycle, and a delay $t_d$ in the data transfer as compared with the external clock signal CLK, namely, the delay time of the D-FF 101 and the output buffer 102 is $t_q+t_b$, if a delay time $t_{B103}$ of the output buffer 103 is set to be not smaller than $\{t_s+t_q+t_b-$Tcycle$\}$, it becomes possible to execute the data transfer with Tcycle.

For example, if the delay time $t_{B103}$ of the output buffer 103 is set to a value not smaller than $\{t_s+t_q+t_b-$Tcycle$\}$, the delay time $t_D$ of the data as compared with the delayed clock signal CLKD is expressed as follows:

$$t_D = t_q+t_b-(t_s+t_q+t_b-\text{Tcycle})$$

Accordingly, $t_D+t_s$ is as follows:

$$\begin{aligned} t_D+t_s &= t_q+t_b-(t_s+t_q+t_b-\text{Tcycle})+t_s \\ &= \text{Tcycle} \end{aligned}$$

Accordingly, it could be understood that it is possible to execute the data transfer with Tcycle.

Figure 4A:
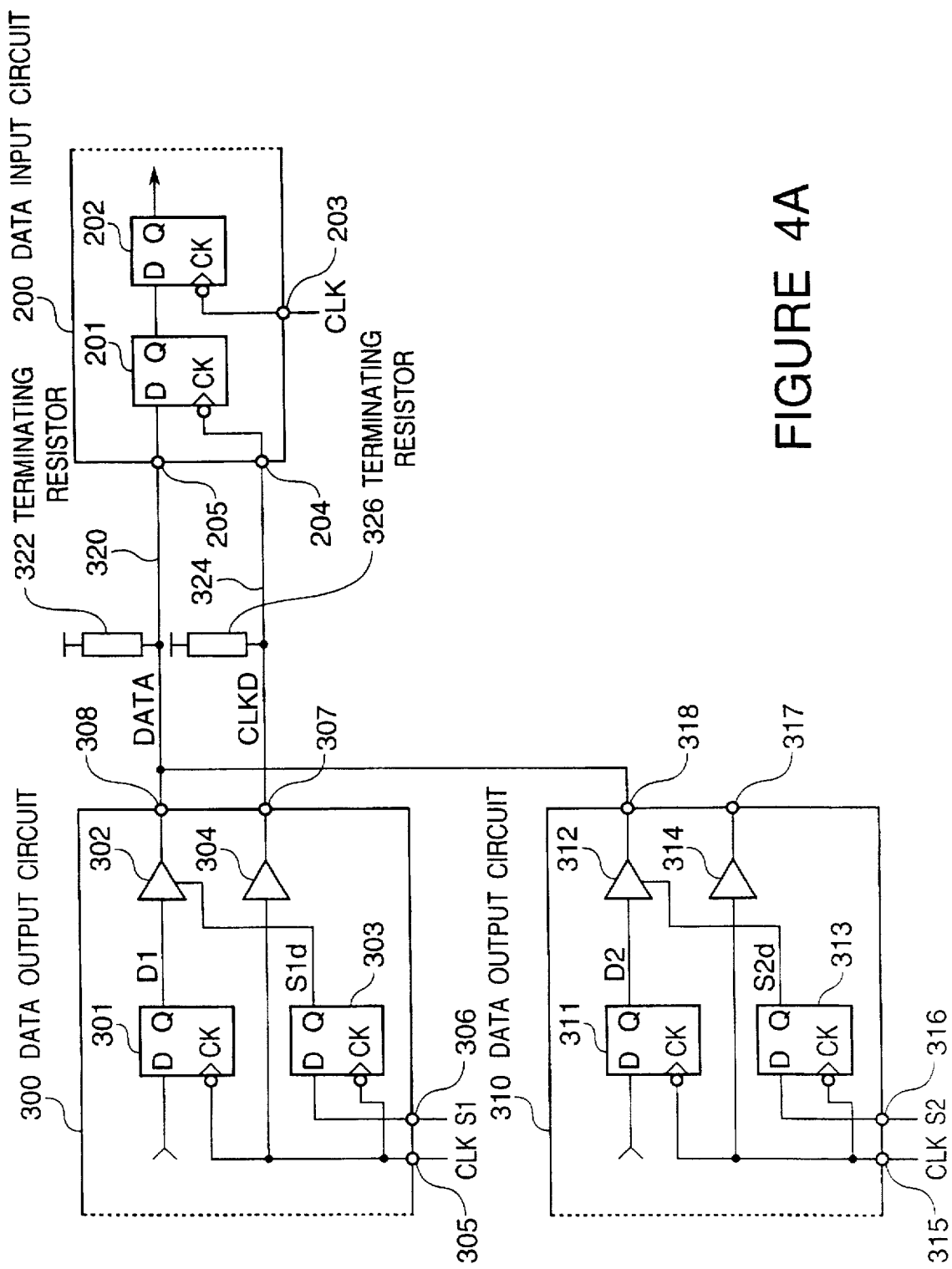
FIG. 4A is a block diagram of an essential part of a second embodiment of the data transfer system in accordance with the present invention, including two data output circuits and one data input circuit.

Referring to FIG. 4A is a block diagram of an essential part of a second embodiment of the data transfer system in accordance with the present invention, including two data output circuits and one data input circuit. This second embodiment is configured to have not only the advantage of the first embodiment capable of executing the data transfer with Tcycle, but also a feature capable of selecting data to be transferred.

The data input circuit shown in FIG. 4A is generally designated with Reference Numeral 200, similarly to the embodiment shown in FIG. 3A, and elements included in the data input circuit 200, similar to those shown in FIG. 4A, are given the same Reference Numerals, and explanation thereof will be omitted.

The two data output circuits included in the data transfer system shown in FIG. 4A have the same construction, and are generally designated with Reference Numeral 300 and 310, respectively.

The data output circuit 300 includes a D-FF 301 having a data input "D" receiving data to be transferred and a clock input "CK" connected to a clock terminal 305 to receive a clock signal CLK supplied from an external device (not shown), and an output buffer 302 having an enable function, called a "tristate output buffer" hereinafter, having an input connected to receive an internal data signal D1 outputted from a non-inverted data output Q of the D-FF 301 and an output connected to a data output terminal 308 for outputting the data. The data output circuit 300 also includes another D-FF 303 having a data input "D" connected to a selection signal terminal 306 receiving a selection signal S1 from an external device (not shown), a clock input "CK" connected to the clock terminal 305 and a non-inverted data output Q connected to an enable input of the tristate output buffer 302, and another output buffer 304 having an input connected to the clock terminal 305 to receive the clock signal CLK and an output connected to a clock output terminal 307 for outputting a delayed clock CLKD which is delayed from the external clock signal CLK by a delay time of the output buffer 304.

The data output terminal 308 of the data output circuit 300 is connected to the data input terminal 205 of the data input circuit 200 through a data signal transmission line 320, which is in turn pulled up through a terminating resistor 322, and the delayed clock output terminal 307 of the data output circuit 300 is connected to the clock input terminal 204 of the data input circuit 200 through a clock signal transmission line 324, which is in turn pulled up through a terminating resistor 326.

With this arrangement, the D-FF 303 latches the selection signal S1 in response to the external clock CLK and outputs the latched selection signal as an enable signal S1$d$ to the enable input of the tristate output buffer 302. When the enable signal S1$d$ is active, the tristate output buffer 302 operates an an ordinary output buffer to output the output D1 of the D-FF 301 through the data output terminal 308 to the data signal transmission line 320. If the enable signal S1$d$ is inactive, an output of the tristate output buffer 302 is maintained in a high impedance condition. On the other hand, the output buffer 304 operates similarly to the output buffer 103 shown in FIGS. 2A and 3A.

As mentioned above, since the data output circuit 310 has the same construction as that of the data output circuit 300, explanation of the construction of the data output circuit 310 will be omitted for simplification of description by giving respective elements of the data output circuit 310, Reference Numerals obtained by adding "10" to the Reference Numerals of the corresponding elements of the data output circuit 300. But, the selection signal terminal 316 of the data output circuit 310 is connected to receive a selection signal S2, different from the selection signal S1.

Furthermore, the data output terminal 318 of the data output circuit 310 is connected to the data signal transmission line 320, but the delayed clock output terminal 317 of the data output circuit 310 is not connected to the clock signal transmission line 324.

Thus, similarly to the D-FF 303, the D-FF 313 latches the selection signal S2 in response to the external clock CLK and outputs the latched selection signal as an enable signal S2$d$ to the enable input of the tristate output buffer 312. When the enable signal S2$d$ is active, the tristate output buffer 312 operates an an ordinary output buffer to output the output D2 of the D-FF 311 through the data output terminal 318 to the data signal transmission line 320. If the enable signal S2$d$ is inactive, an output of the tristate output buffer 312 is maintained in a high impedance condition.

Thus, the data output circuits 300 and 310 are alternatively selected by the selection signals S1 and S2. First, a case that data output circuit 300 is selected will be described with reference to FIG. 4B, which is a timing chart illustrating an operation of the data transfer system shown in FIG. 4A. Here, each of the D-FFs 301 and 311 operates similarly to the D-FF 101 of the first embodiment shown in FIGS. 2A and 3A.

In this case, the selection signal S1 is activated to a high level, and on the other hand, the selection signal S2 is maintained at a low level, namely, in an inactive condition. The high level of the selection signal S1 is latched in the D-FF 303 in synchronism with a falling of the external clock CLK, so that the enable signal S1$d$ is outputted to the tristate output buffer 302 so as to activate the tristate output buffer 302. During the active condition of the tristate output buffer 302, the data D1 outputted from the D-FF 301 is supplied through the output buffer 302 and the output data terminal 308 to the data signal transmission line 320.

Figure 4B:
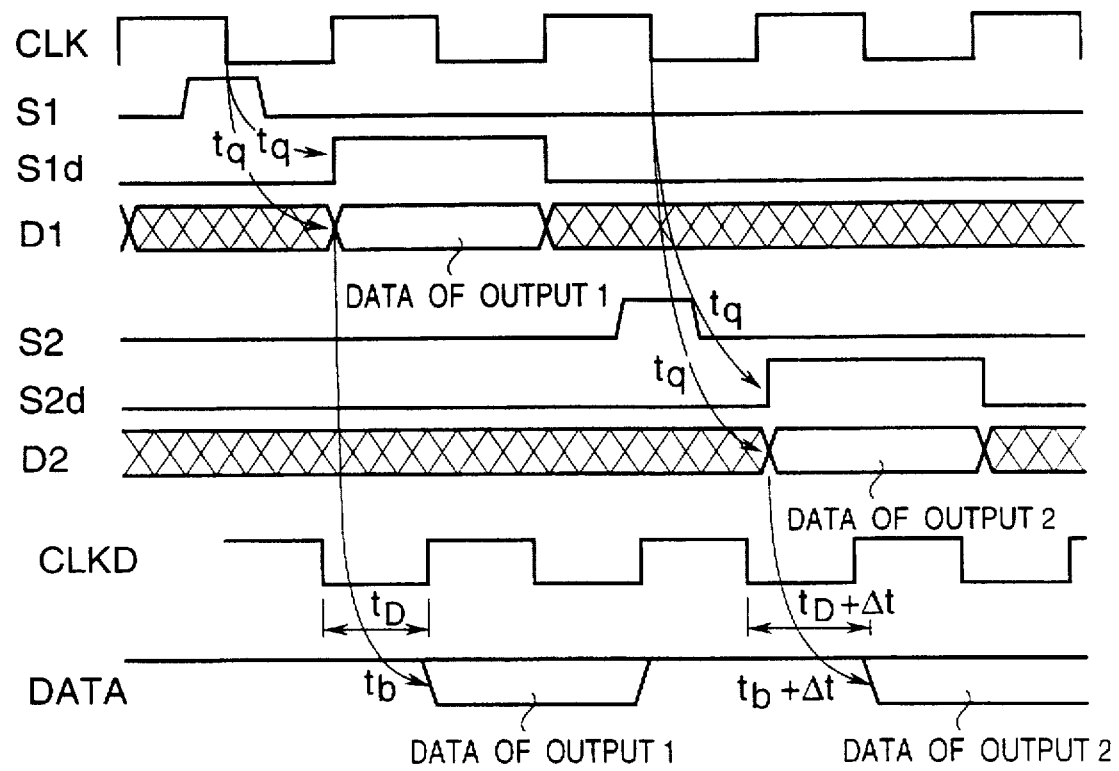
FIG. 4B is a timing chart illustrating an operation of the data transfer system shown in FIG. 4A.

Similarly to the first embodiment shown in FIG. 3A, the data outputted onto the data signal transmission line 320 is latched in the first-stage D-FF 201 in response to the delayed clock signal CLKD, as shown as "DATA OF OUTPUT 1" in the column "DATA" of FIG. 4B, and then, is latched in the second-stage D-FF 202 in response to the external clock signal CLK.

On the other hand, since the selection signal S2 is at the low level as mentioned above, the enable signal S2d outputted from the D-FF 313 in the non-selected data output circuit 310 is maintained at the low level, so that the tristate output buffer 312 is in the inactive condition. Namely, the output of the tristate output buffer 312 is maintained in in a high impedance condition, so that the data transfer is cut off or inhibited by the tristate output buffer 312. In this connection, since the data signal transmission line 320 is pulled up through the terminating resistor 322 at the side of the data input circuit 200, no malfunction occurs in the data input circuit 200.

To the contrary, if the selection signal S1 is maintained at a low level, and on the other hand, the selection signal S2 is activated to a high level, the high level of the selection signal S2 is latched in the D-FF 313 in synchronism with a falling of the external clock CLK, so that the enable signal S2d is outputted to the tristate output buffer 312 so as to activate the tristate output buffer 312. During the active condition of the tristate output buffer 312, the data D2 outputted from the D-FF 311 is supplied through the output buffer 312 and the output data terminal 318 to the data signal transmission line 320.

Similarly to the first embodiment shown in FIG. 3A, the data outputted onto the data signal transmission line 320 is latched in the first-stage D-FF 201 in response to the delayed clock signal CLKD, as shown as "DATA OF OUTPUT 2" in the column "DATA" of FIG. 4B, and then, is latched in the second-stage D-FF 202 in response to the external clock signal CLK.

In the non-selected data output circuit 300, at this time, since the selection signal S1 is at the low level, the enable signal S1d outputted from the D-FF 303 is maintained at the low level, so that the tristate output buffer 302 is in the inactive condition. Namely, the output of the tristate output buffer 302 is maintained in in a high impedance condition, so that the data transfer is cut off or inhibited by the tristate output buffer 302.

The second embodiment shown in FIG. 4A is characterized in that only the data output circuit 300 outputs the delayed clock signal CLKD to the clock signal transmission line 324, hence to the data input circuit 200. Here, assumed that, on a mounting circuit board, the wiring is so designed that a wiring delay in the data signal outputted from the data output circuit 300 is equal to a wiring delay in the delay clock signal CLKD outputted from the same data output circuit 300, but the data output circuit 310 is located remote from the data input circuit 200 with a distance longer than that between the data output circuit 300 and the data input circuit 200, so that a wiring delay in the data signal outputted from the data output circuit 310 is longer than the wiring delay in the data signal outputted from the data output circuit 300, by a wiring delay amount difference Δt. In this condition, only the data signal outputted from the data output circuit 310 is transferred at at a timing later than the other signal by the wiring delay amount difference Δt. Therefore, the delay in the transfer data as compared with the delayed clock signal CLKD concerning the data signal outputted from the data output circuit 310 becomes $t_D+\Delta t$, and therefore, the data transfer cycle is limited to not smaller than $t_D+\Delta t+t_r$.

If the data to be transferred and the delayed clock signal are supplied from the same data output circuit, it is possible to easily match the wiring delay time of the data to be transferred and the wiring delay time of the delayed clock signal.

Figure 5A:
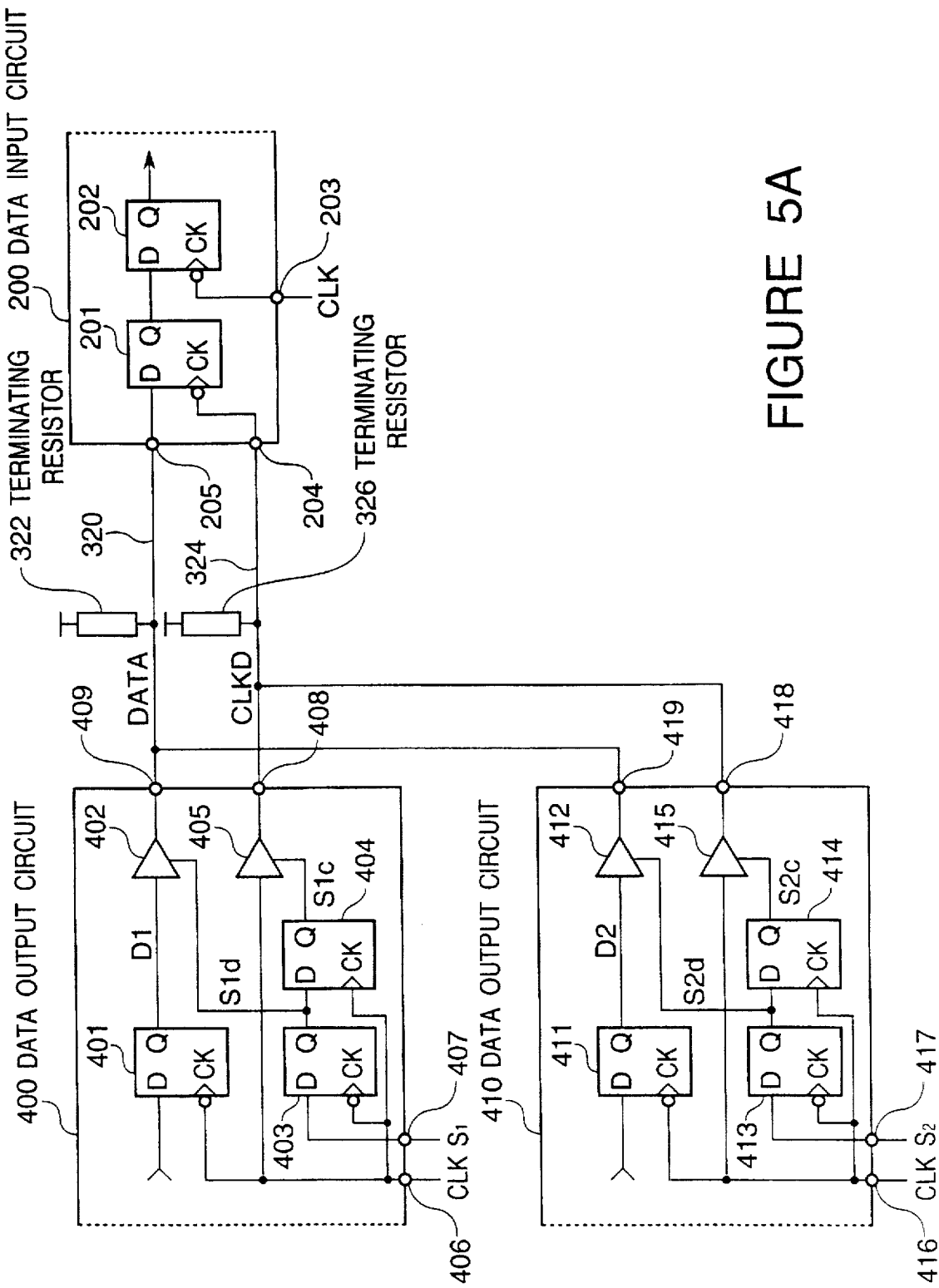
FIG. 5A is a block diagram of an essential part of a third embodiment of the data transfer system in accordance with the present invention, including two data output circuits and one data input circuit.

Referring to FIG. 5A, there is shown a block diagram of an essential part of a third embodiment of the data transfer system in accordance with the present invention, including two data output circuits and one data input circuit, and configured to overcome the above mentioned disadvantage of the second embodiment, by supplying both the data to be transferred and the delayed clock signal from a selected data output circuit. Therefore, in FIG. 5A, elements similar to those shown in FIG. 4A are given the same Reference Numerals, and explanation thereof will be omitted.

The two data output circuits included in the data transfer system shown in FIG. 5A have the same construction, and are generally designated with Reference Numeral 400 and 410, respectively.

The data output circuit 400 includes a D-FF 401 having a data input "D" receiving data to be transferred and a clock input "CK" connected to a clock terminal 406 to receive a clock signal CLK supplied from an external device (not shown), and a tristate output buffer 402 having an input connected to receive an internal data signal D1 outputted from a non-inverted data output Q of the D-FF 401 and an output connected to a data output terminal 409 for outputting the data, and another tristate output buffer 405 having an input connected to the clock terminal 405 to receive the clock signal CLK and an output connected to a clock output terminal 408 for outputting a delayed clock CLKD which is delayed from the external clock signal CLK by a delay time of the output buffer 405. The data output circuit 400 also includes a second D-FF 403 having a data input "D" connected to a selection signal terminal 407 receiving a selection signal S1 from the external device, a clock input "CK" connected to the clock terminal 405, and a non-inverted data output Q connected to an enable input of the tristate output buffer 402, and a third D-FF 404 having a data input "D" connected to the non-inverted data output Q of the second D-FF 403, a clock input "CK" connected to the clock terminal 405, and a non-inverted data output Q connected to an enable input of the tristate output buffer 405.

The data output terminal 409 of the data output circuit 400 is connected to the data signal transmission line 320, and the delayed clock output terminal 408 of the data output circuit 400 is connected to the clock signal transmission line 324.

Figure 5B:
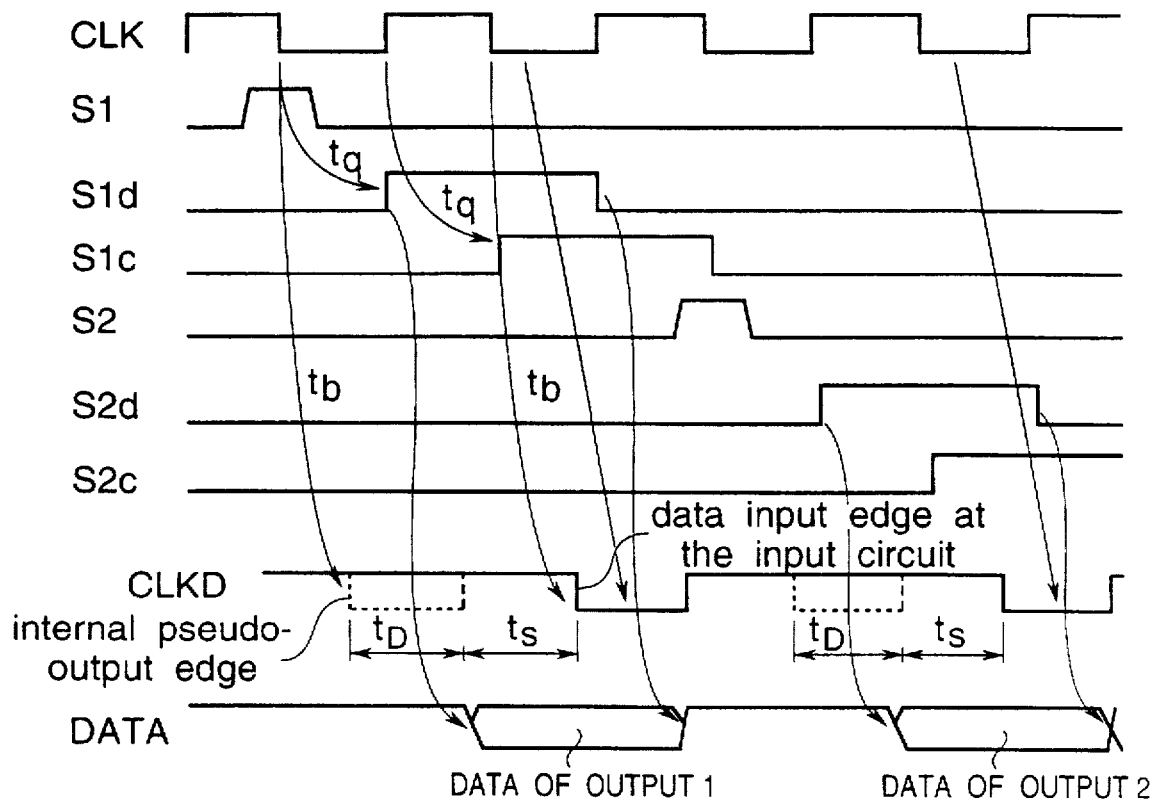
FIG. 5B is a timing chart illustrating an operation of the data transfer system shown in FIG. 5A.

As shown in FIG. 5B which is a timing chart illustrating an operation of the data transfer system shown in FIG. 5A, the D-FF 403 latches the selection signal S1 in response to the external clock CLK and outputs the latched selection signal as an enable signal S1d to the enable input of the tristate output buffer 402. When the enable signal S1d is active, the tristate output buffer 402 operates an an ordinary output buffer to output the output D1 of the D-FF 401 through the data output terminal 409 to the data signal transmission line 320. If the enable signal S1d is inactive, an output of the tristate output buffer 402 is maintained in a high impedance condition. On the other hand, the D-FF 404 latches the enable signal S1d in response to the external clock CLK and outputs the latched enable signal S1d as a second enable signal S1c to the enable input of the tristate output buffer 405. When the enable signal S1c is active, the tristate output buffer 405 operates an an ordinary output buffer to output the delayed clock signal CLKD through the clock output terminal 408 to the clock signal transmission line 324. If the enable signal S1c is inactive, an output of the tristate output buffer 405 is maintained in a high impedance condition.

As mentioned above, since the data output circuit 410 has the same construction as that of the data output circuit 400, explanation of the construction of the data output circuit 410 will be omitted for simplification of description by giving respective elements of the data output circuit 410, Reference Numerals obtained by adding "10" to the Reference Numerals of the corresponding elements of the data output circuit 400. But, the selection signal terminal 417 of the data output circuit 410 is connected to receive a selection signal S2, different from the selection signal S1. In addition, the data output terminal 419 of the data output circuit 410 is connected to the data signal transmission line 320, and the delayed clock output terminal 418 of the data output circuit 410 is connected to the clock signal transmission line 324.

Thus, similarly to the D-FF 403, and as shown in FIG. 5B, the D-FF 413 latches the selection signal S2 in response to the external clock CLK and outputs the latched selection signal as an enable signal S2d to the enable input of the tristate output buffer 412. Similarly to the D-FF 404, the D-FF 414 latches the enable signal S2d in response to the external clock CLK and outputs the latched enable signal S2d as the enable signal S2c to the enable input of the tristate output buffer 415.

In the third embodiment, the delayed clock signal CLKD is outputted only when either the data output circuit 400 or 410 is selected.

Further, since each of the data output circuits outputs both the data to be transferred and a timing signal for latching the data, to the data input circuit, if it is so designed that the respective wiring delay times of the data and the delayed clock signal CLKD from each of the data output circuits 400 and 410 to the data input circuit 200 are equal to each other, it is possible to solve the above mentioned delay difference Δt.

The above mentioned wiring delay times are required to be equal to each other for purpose of minimizing the data delay $t_D$. Even if each data output circuit outputs the data to be transferred and the delayed clock signal CLKD onto the data signal transmission line and the clock signal transmission line, respectively, with the delay $t_D$ therebetween, if the delay amount of the delayed clock signal on the transmission line (wiring delay amount) is different from the delay amount of the data signal on the transmission line (wiring delay amount), the delay $t_D$ changes in the data input circuit by the amount corresponding to the difference between the wiring delay amounts. Accordingly, it is necessary to make the delay amount of the delayed clock signal on the transmission line equal to the delay amount of the data signal on the transmission line. In this connection, even if it is allowed that the wiring delay amount from the data output circuit 400 to the data input circuit 200 is different from the wiring delay amount from the data output circuit 410 to the data input circuit 200, it is necessary to equalize the wiring delay amount of the delayed clock signal and the wiring delay amount of the data signal, which are outputted from the same data output circuit to the data input circuit.

Incidentally, since the delayed clock signal CLKD is driven only when the corresponding data output circuit is selected, this is effective in reducing the amount of consumed electric power.

Here, the D-FF, the output buffer and the tristate output buffer used in the above mentioned embodiments will be described with reference to FIGS. 6A, 6B and 6C.

Figure 6A:
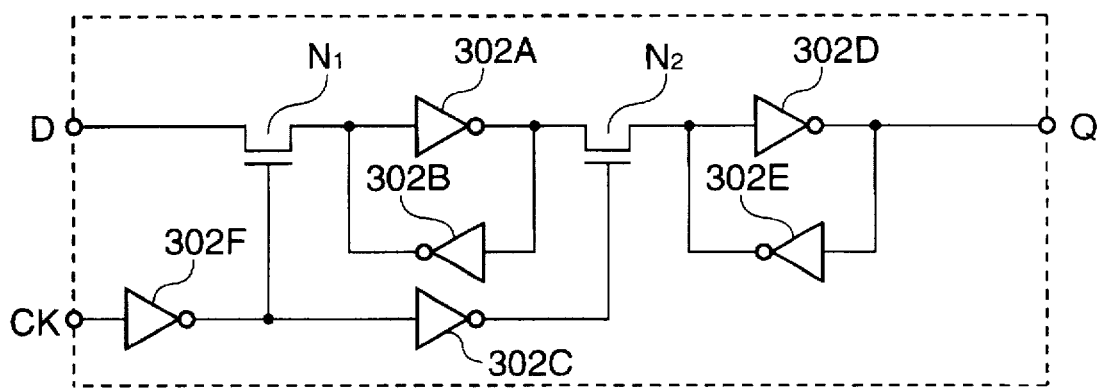
FIG. 6A is a circuit diagram showing one example of the D-FF.

Referring to FIG. 6A, there is shown a circuit diagram showing one example of the D-FF, which is well known to persons skilled in the art.

The shown D-FF includes a first latch circuit composed of a pair of inverters 302A and 302B connected to form a closed loop and having an input node (connected through a first transfer gate N1 to the data input "D", and a second latch circuit composed of a pair of inverters 302D and 302E connected to form a closed loop and having an input node connected through a second transfer gate N2 to an output node of the first latch circuit. An output node of the second latch circuit is connected to the non-inverted data output "D" of the D-FF. A clock input "CK" of the D-FF is connected to an input of a first inverter 302F, which in turn has an output connected to a gate of the first transfer gate N1 and an input of a second inverter 302C. An output of the second inverter 302C is connected to a gate of the second transfer gate N2.

With this arrangement, the data is latched in the first latch in response to the falling of the external clock signal CLK, and the data latched in the first latch is latched in the second latch, namely, is outputted from the second latch, in response to the rising of the external clock signal CLK, occurring next to the above mentioned falling of the external clock signal CLK. Thus, the data having the same phase as that of the data supplied to the data input "D" is outputted from the output "Q".

The D-FF shown in FIG. 6A corresponds to the D-FF 404 and the D-FF 414 depicted to have no small circle at a clock input "CK" in FIG. 5A.

On the other hand, each of the D-FFs depicted to have a small circle at a clock input "CK", in FIGS. 1A, 1C, 2A, 3A, 4A and 5A, excluding the D-FF 404 and the D-FF 414 in FIG. 5A, is configured to latch the input data in response to the rising of the external clock signal CLK, and to output the latched data in response to the falling of the external clock signal CLK, occurring next to the above mentioned rising of the external clock signal CLK. In this type of D-FF, the inverter 302F shown in FIG. 6A is removed, so that the clock input "CK" is connected directly to the gate of transfer gate N1 and the input of the inverter 302C.

Figure 6B:
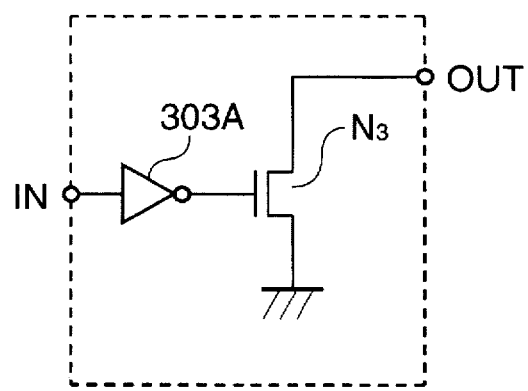
FIG. 6B is a circuit diagram showing one example of the output buffer.

Referring to FIG. 6B, there is shown a circuit diagram showing one example of the output buffer, which is well known to persons skilled in the art. The shown output buffer includes an input "IN" connected through an inverter 303A to a gate of open-drain-connection N-channel MOS transistor N3 having a grounded source. Thus, the data having the same phase as that of the data supplied to the input "IN" is outputted from the drain of the N-channel MOS transistor N3 to an output "OUT".

Figure 6C:
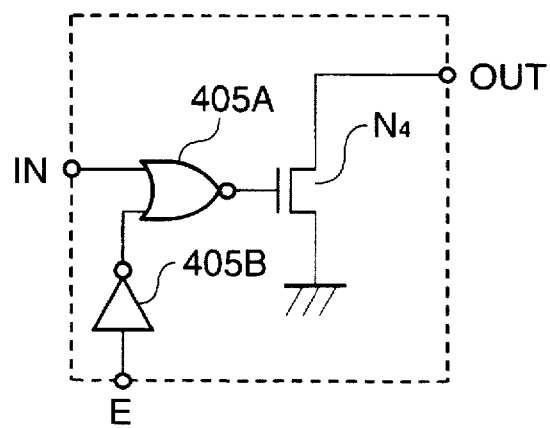
FIG. 6C is a circuit diagram showing one example of the output buffer having an enable function.

Referring to FIG. 6C, there is shown a circuit diagram showing one example of the output buffer having the enable function, namely, the tristate output buffer, which is well known to persons skilled in the art. The shown tristate output buffer includes a two-input NOR gate 405A having a first input connected to a data input "IN" of the tristate output buffer and a second input connected through an inverter 405B to an enable input "E" of the tristate output buffer. An output of the NOR gate 405A is connected to a gate of open-drain-connection N-channel MOS transistor N4 having a grounded source. Thus, when the enable input "E" of the tristate output buffer is maintained at a low level, the output of the NOR gate 405A is fixed to a low level, so that the N-channel MOS transistor N4 is maintained off, and therefore, a drain of the N-channel MOS transistor N4 is maintained in a high impedance condition. However, when the enable input "E" of the tristate output buffer is maintained at a high level, the NOR gate 405A operates as an inverter similarly to the inverter 303A shown in FIG. 6B. Therefore, the data having the same phase as that of the data supplied to the input "IN" is outputted from the drain of the N-channel MOS transistor N4 to an output "OUT".

As seen from the above description made with reference to the drawings, the data transfer system in accordance with the present invention for use in the integrated circuit is characterized in that a data output circuit comprises a data outputting means for outputting data to be transferred, in synchronism with an external clock signal supplied from an external, and a clock delay means receiving the external clock signal for outputting a delayed clock signal which is delayed from the external clock signal by a data delay amount of the data outputting means, and on the other hand, a data input circuit includes a first stage for receiving the data to be transferred outputted from the data outputting means of the data output circuit, in synchronism with the delayed clock signal supplied from the clock delay means of the data output circuit, and a second stage for fetching the data received in the first stage, in synchronism with the external clock signal. Thus, without using a PLL circuit, it is possible to speed up the data transfer by the amount substantially equivalent to the fact that the internal clock signal is advanced by a predetermined time by using a PLL circuit.

The invention has thus been shown and described with reference to the specific embodiments. However, it should be noted that the present invention is in no way limited to the details of the illustrated structures but changes and modifications may be made within the scope of the appended claims.

I claim:

1. A data transfer system for use in an integrated circuit, including a data output circuit for outputting data and a data input circuit for receiving said data, said data output circuit comprising a data outputting means for outputting data to be transferred, in synchronism with an external clock signal supplied from an external, and a clock delay means receiving said external clock signal for outputting a delayed clock signal which is delayed from said external clock signal by a delay amount equal to a data delay amount of said data outputting means, and said data input circuit including a first stage for receiving said data to be transferred outputted from said data outputting means of said data output circuit, in synchronism with said delayed clock signal supplied from said clock delay means of said data output circuit, and a second stage for fetching the data received in said first stage, in synchronism with said external clock signal.

2. A data transfer system claimed in claim 1 wherein said delay amount of said clock delay means is set to $\{t_s + t_d - \text{Tcycle}\}$ where $t_s$ is a set-up time of the data input in said data input circuit, Tcycle is a data transfer cycle $t_d$ is the delay amount of said data to be transferred, as compared with said external clock signal.

3. A data transfer system claimed in claim 1 wherein said data output circuit further includes a D-type flipflop having a data input connected to receive said data to be transferred and a clock input connected to receive said external clock signal, and said data outputting means is constituted of a first output buffer having an input connected to a data output of said D-type flipflop and an output connected to an output terminal of said data output circuit, said clock delay means is constituted of a second output buffer having an input connected to receive said external clock signal and an output connected to a delayed clock output terminal of said data output circuit, said second output buffer having a delay time substantially equal to a delay time of said first output buffer, and wherein said first stage of said data input circuit is constituted of a first stage D-type flipflop having a data input connected to receive said data to be transferred outputted from said first output buffer of said data output circuit and a clock input connected to receive said delayed clock signal outputted from said second output buffer of said data output circuit, and said second stage of said data input circuit is constituted of a second stage D-type flipflop having a data input connected to a data output of said first stage D-type flipflop and a clock input connected to receive said external clock signal.

4. A data transfer system claimed in claim 1 wherein said data output circuit further includes a data transfer control means for inhibiting the outputting of said data to be transferred, in response to a selection signal supplied from the external, and further including a second data output circuit having the same construction as that of said first mentioned data output circuit, a data output terminal of each of said data output circuits being connected in common to said data input circuit, said delayed clock signal outputted from only a selected one of said data output circuits being supplied to said first stage of said data input circuit.

5. A data transfer system claimed in claim 4 wherein each of said data output circuits further includes a first D-type flipflop having a data input connected to receive said data to be transferred and a clock input connected to receive said external clock signal, and said data outputting means is constituted of a tristate output buffer having an input connected to a data output of said D-type flipflop and an output connected to an output terminal of said data output circuit, said clock delay means is constituted of an output buffer having an input connected to receive said external clock signal and an output connected to a delayed clock output terminal of said data output circuit, said output buffer having a delay time substantially equal to a delay time of said tristate output buffer, said data transfer control means is constituted of a second D-type flipflop having a data input connected to receive said selection signal, a clock input connected to receive said external clock signal, and a data output connected to an enable input of said tristate output buffer, and wherein said first stage of said data input circuit is constituted of a first stage D-type flipflop having a data input connected to receive, in common, said data to be transferred outputted from each of said first output buffer of each of said data output circuits, and a clock input connected to receive said delayed clock signal outputted from said second output buffer of a selected one of said data output circuits, and said second stage of said data input circuit is constituted of a second stage D-type flipflop having a data input connected to a data output of said first stage D-type flipflop and a clock input connected to receive said external clock signal.

6. A data transfer system claimed in claim 1 wherein said data output circuit further includes a data transfer control means for inhibiting the outputting of said data to be transferred, in response to a selection signal supplied from the external, and a delayed clock control means controlled by said data transfer control means for inhibiting the outputting of said delayed clock signal, and further including a second data output circuit having the construction as that of said first mentioned data output circuit, a data output terminal of each of said data output circuits being connected in common to said data input circuit, and a delayed clock output terminal of each of said data output circuits being connected in common to said data input circuit, so that only said data and said delayed clock signal outputted from one selected by said selection signal, among said data output circuits, are supplied to said data input circuit.

7. A data transfer system claimed in claim 6 wherein each of said data output circuits further includes a first D-type flipflop having a data input connected to receive said data to be transferred and a clock input connected to receive said external clock signal, and said data outputting means is constituted of a first tristate output buffer having an input connected to a data output of said D-type flipflop and an output connected to an output terminal of said data output circuit, said clock delay means is constituted of a second tristate output buffer having an input connected to receive said external clock signal and an output connected to a delayed clock output terminal of said data output circuit, said second tristate output buffer having a delay time substantially equal to a delay time of said first tristate output buffer, said data transfer control means is constituted of a second D-type flipflop having a data input connected to receive said selection signal, a clock input connected to receive said external clock signal, and a data output connected to an enable input of said tristate output buffer, said delayed clock control means is constituted of a third D-type flipflop having a data input connected to said data output of said second D-type flipflop, a clock input connected to receive said external clock signal, and a data output connected to an enable input of said second tristate output buffer, and wherein said first stage of said data input circuit is constituted of a first stage D-type flipflop having a data input connected to receive, in common, said data to be transferred outputted from each of said first output buffer of each of said data output circuits, and a clock input connected to receive, in common, said delayed clock signal outputted from said second output buffer of each of said data output circuits, and said second stage of said data input circuit is constituted of a second stage D-type flipflop having a data input connected to a data output of said first stage D-type flipflop and a clock input connected to receive said external clock signal.

\* \* \* \* \*